(12) United States Patent
Dechene et al.

(10) Patent No.: US 10,170,309 B2
(45) Date of Patent: Jan. 1, 2019

(54) DUMMY PATTERN ADDITION TO IMPROVE CD UNIFORMITY

(71) Applicant: GLOBALFOUNDRIES INC., Grand Cayman (KY)

(72) Inventors: Daniel J. Dechene, Wappingers Falls, NY (US); Geng Han, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/422,689

(22) Filed: Feb. 15, 2017

(65) Prior Publication Data

US 2018/0233361 A1 Aug. 16, 2018

(51) Int. Cl.
| | |
|---|---|
| H01L 21/00 | (2006.01) |
| H01L 27/11 | (2006.01) |
| H01L 21/033 | (2006.01) |
| H01L 27/02 | (2006.01) |
| H01L 27/118 | (2006.01) |

(52) U.S. Cl.
CPC ...... *H01L 21/0337* (2013.01); *H01L 27/0207* (2013.01); *H01L 27/1104* (2013.01); *H01L 27/11803* (2013.01)

(58) Field of Classification Search
CPC .......... H01L 21/0274; H01L 29/41791; H01L 27/1104; H01L 21/823475; H01L 29/66545; H01L 21/28132; H01L 21/76802; H01L 21/823431; H01L 27/0207; H01L 21/76877; H01L 21/0337; H01L 21/823821; H01L 28/00; H01L 27/1116; H01L 27/0924; H01L 21/82347; H01L 21/31144
See application file for complete search history.

(56) References Cited

U.S. PATENT DOCUMENTS

| | | | |
|---|---|---|---|
| 7,247,574 B2 | 7/2007 | Broeke et al. | |
| 8,099,684 B2 | 1/2012 | Meiring et al. | |
| 8,329,360 B2 * | 12/2012 | Huang | G03F 7/70283 257/620 |
| 8,679,924 B2 * | 3/2014 | Wei | H01L 29/785 257/E21.014 |
| 8,680,671 B2 * | 3/2014 | Hsieh | H01L 27/11565 257/708 |
| 9,252,022 B1 * | 2/2016 | Dechene | H01L 21/3086 |
| 9,362,119 B2 * | 6/2016 | Ou | H01L 21/0274 |
| 9,653,295 B1 * | 5/2017 | Huang | H01L 21/0337 |
| 9,842,843 B2 * | 12/2017 | Liaw | H01L 27/1104 |
| 9,875,906 B2 * | 1/2018 | Chang | H01L 21/3086 |
| 2010/0187611 A1 * | 7/2010 | Schiwon | G03F 7/0035 257/369 |
| 2011/0245949 A1 * | 10/2011 | Chih | G03F 7/70466 700/97 |

* cited by examiner

*Primary Examiner* — Savitr Mulpuri
(74) *Attorney, Agent, or Firm* — Scully Scott Murphy and Presser; Frank Digiglio

(57) ABSTRACT

A multiple exposure patterning process includes the incorporation of a dummy feature into the integration flow. The dummy feature, which is placed to overlie an existing masking layer and thus does not alter the printed image, improves the critical dimension uniformity (CDU) of main critical (non-dummy) features at the same masking level.

5 Claims, 3 Drawing Sheets

DUMMY PATTERN ADDITION TO IMPROVE CD UNIFORMITY

BACKGROUND

The present application relates generally to semiconductor device manufacturing, and more specifically to approaches for fabricating semiconductor devices using double patterning memorization techniques.

The microelectronics industry continues to strive to incorporate more circuitry having greater complexity onto a single integrated circuit (IC) chip. Achieving this goal generally involves decreasing the size of individual devices within each circuit by decreasing the critical dimension (CD) of device elements together with the pitch or periodicity associated with such elements, i.e., the CD of an element added to the inter-element spacing. Microlithography tooling and attendant processing methods are employed to create the structures used to fabricate devices and, as such, are continually under development to meet industry milestones related to the critical dimension and pitch metrics of each new technology generation.

High numerical aperture (NA) 193 nm optical projection stepper/scanner systems in combination with advanced photoresist processes are capable of defining complex patterns that include isolated and dense resist features having CDs and pitches less than the associated exposure wavelength. However, to meet the requirements of device design rules that continue to challenge the resolution limits of existing processes and tooling, additional more specialized techniques are being developed to further enhance resolution. Such techniques include multi-patterning processes in which device patterns having potentially optically un-resolvable features are decomposed into two or more complementary, and more easily resolvable patterns, each including features with larger CDs and/or a relaxed pitch.

Notwithstanding recent advancements in patterning processing and hardware, it would be advantageous to provide methods for fabricating integrated circuits using multi-patterning processes that provide increased CD uniformity.

SUMMARY

Disclosed is a patterning process where dummy features are incorporated into the integration flow of a multiple exposure patterning scheme in order to improve overall critical dimension uniformity of structures formed on a semiconductor substrate. The placement of dummy features that overlay an existing masking layer improves the critical dimension uniformity (CDU) of main critical structures without altering the design of the final patterned structure. In certain embodiments, the dummy features are retained in final patterned architecture.

In accordance with embodiments of the present application, a method of forming a semiconductor device includes forming a first masking layer and a second masking layer over a semiconductor substrate. The first masking layer includes first features and the second masking layer includes second features, wherein a first portion of the second features are formed laterally adjacent to the first features and a second portion of the second features entirely overlie the first features.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
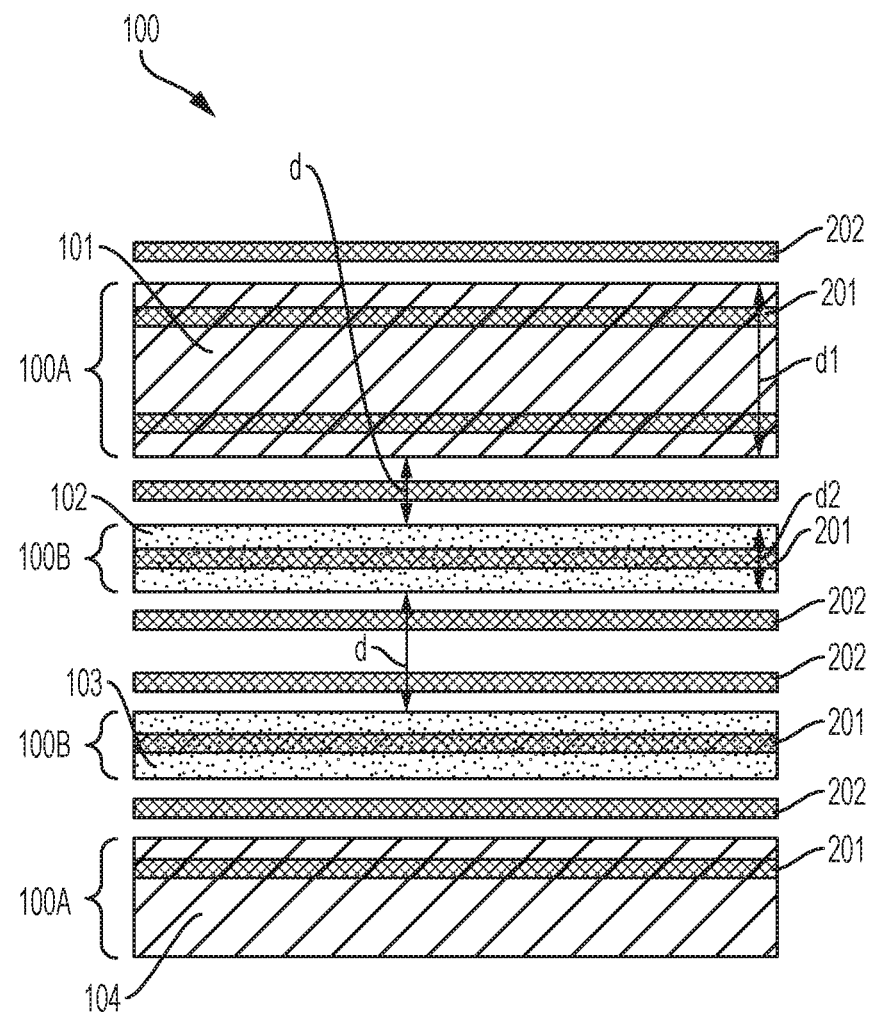
FIG. 1 is a schematic diagram of a comparative pattern layout including first and second sub-patterns.

Reference will now be made in greater detail to various embodiments of the subject matter of the present application, some embodiments of which are illustrated in the accompanying drawings. The same reference numerals will be used throughout the drawings to refer to the same or similar parts.

Double patterning lithography (DPL) is a processing platform for achieving enhanced feature density during the manufacture of integrated circuits (ICs). Integrated circuits typically include a plurality of semiconductor devices formed in, on and/or over a semiconductor substrate, and further include networks of electrically conductive structures (e.g., metallization layers) that connect the devices. The conductive networks typically include multiple layers of metal lines that are interconnected by conductive vias.

The various semiconductor device layers of an IC can include the networks of conductive structures and various active device architectures, e.g., transistors, capacitors, inductors, resistors, etc., located in, on and/or above the semiconductor substrate. Within such structures, conductive metal lines run parallel to the semiconductor substrate and conductive vias and/or conductive contacts run perpendicular to the substrate between the metal lines and/or semiconductor devices. Additional features, such as semiconductor fins formed over the substrate, may be leveraged to construct multi-gate devices such fin field effect transistors (FinFETs), for example. Double patterning lithography may be used to form the network of electrically conductive line and vias, and/or to define sub-arrays of semiconductor fins and associated gate patterns for exemplary three-dimensional transistors.

A master pattern layout for the device architecture may include, for example, target conductive lines (e.g., design details for conductive lines) and target interconnecting vias and/or contacts (e.g., design details for interconnecting vias and/or interconnecting contacts) for connecting the target metal lines with an underlying or overlying semiconductor device layer (e.g., an underlying metallization layer) or an underlying or overlying semiconductor device (e.g., an underlying source/drain junction of an exemplary transistor). In addition to or in lieu of the foregoing, a master pattern layer may include target fins (e.g., design details for forming fin arrays and/or design details for removing selected fins or portions thereof from the pre-defined arrays).

Typically, and by way of example, multi-patterning processes decompose the target metal lines within a device layer into two or more complementary and more easily resolvable patterns that are transferred to corresponding photomasks, and at least one additional pattern that is transferred to a separate photomask for the target interconnecting via/contacts. For instance, a target metal line may be decomposed into first and second sub-patterns having overlapping portions defining a stitch, such that two independent photomasks are used in the aggregate to define a structure from two or more overlapping structures. A first photomask is generated that corresponds to the first sub-pattern. A second photomask is generated that corresponds to the second sub-pattern. In a further example, multi-patterning processes can be used to selectively pattern and remove unwanted semiconductor fins or portions thereof in conjunction with the manufacture of a FinFET device.

Disclosed is a method of forming device structures. The method includes forming a dummy masking feature over an existing masking feature to improve overall patterning uniformity (e.g., lithography and/or etch uniformity). According to various embodiments, the incorporation of the dummy feature into a multiple exposure area improves the CDU of adjacent features without altering the final image or structure on the substrate. That is, the dummy feature does not impact the final intent of the patterned structure, but beneficially impacts the pattern fidelity of features formed at the same masking level. The dummy feature(s) can be created using a rules-based or a model-based placement algorithm, and the process can be iterative, where multiple dummy features are formed in succession. Repetitive patterning can widen the process window for the method and further increase the robustness of the process.

Various embodiments relate to methods for fabricating integrated circuits using improved multi-patterning processes. In an exemplary embodiment, a master pattern layout for a semiconductor device layer includes a first target structure and a second target structure that are decomposed respectively into a first sub-pattern and a second sub-pattern. A first photomask is generated that corresponds to the first sub-pattern, and a second photomask is generated that corresponds to the second sub-pattern, such that the first and second sub-patterns are defined by separate lithographic levels. It will be appreciated that although various embodiments are described herein in connection with two masking levels, that three or more masking levels may be implemented.

In certain embodiments, one or both of the first and second sub-patterns include redundant features that do not define the respective first or second target structure, but which overlap the other of the first and the second sub-pattern. That is, a redundant feature of the first sub-pattern may overlap the second sub-pattern and/or a redundant feature of the second sub-pattern may overlap the first sub-pattern. According to various exemplary embodiments, a redundant feature of the first sub-pattern may overlap a portion of the second sub-pattern, a redundant feature of the second sub-pattern may overlap a portion of the first sub-pattern, or a redundant feature of the first sub-pattern may overlap a portion of the second sub-pattern and a redundant feature of the second sub-pattern may overlap a portion of the first sub-pattern.

As used herein, patterns "overlap" or "overlie" one another if they have an area in common. A pattern is redundant if its entire structure overlaps another pattern, i.e., the area of the redundant pattern is a subset of the pattern it overlaps. As will be appreciated, the terms "redundant feature" and "dummy feature" are used interchangeably herein.

The dummy features function as resolution assist features that can provide significant lithographic benefit, including optical proximity effect correction on a mask, resulting in an improvement of the CDU of the master pattern layer. In certain embodiments, the incorporation into one of the masking levels of the dummy features modifies (e.g., increases or decreases) the periodicity of that masking level such that the masking level containing the dummy features approaches that of a grating, which has improved printability relative to patterns having greater or mixed periodicity.

Referring to FIG. 1, a master pattern layout 100 for an exemplary SRAM cell includes four target semiconductor fin retention regions that are correspondingly numbered 101, 102, 103 and 104, and which overlie target regions 201 for semiconductor fins to be formed over a semiconductor substrate. According to various embodiments, the target fin retention regions 101-104 define the location of one or more masking layers (N>1, e.g., N>3) used to protect underlying fins within target regions 201 during an etch process that removes unprotected fins within target regions 202 in order to define a desired architecture.

The pattern layout 100 can be created with a computer aided design (CAD) program, for example. First and second sub-patterns 100A, 100B each satisfy a set of multi-patterning space rules as defined in FIG. 1.

By way of non-limiting example, the width (d1, d2) of target fin retention regions 101-104 may independently range from 25 to 100 nm, e.g., 25, 30, 35, 40, 45, 50, 55, 60, 65, 70, 75, 80, 85, 90, 95 or 100 nm, including ranges between any of the foregoing values. The spacing (d) between adjacent target fin retention regions may range from 25 to 75 nm, e.g., 25, 30, 35, 40, 45, 50, 55, 60, 65, 70 or 75 nm, including ranges between any of the foregoing values. In certain embodiments, the space between the target fin retention regions 101-104 in the master pattern layout 100 is such that the master pattern layout 100 cannot be printed using a single mask with available photolithography tools. Each target fin retention region 101-104 may be configured to mask a single fin or a plurality of fins.

The master pattern layout 100 is decomposed into a first sub-pattern 100A including the target fin retention regions 101 and 104, and a second sub-pattern 100B including the target fin retention regions 102 and 103. In the illustrated example, each sub-pattern 100A, 100B fewer than all of the target fin retention regions in the master pattern layout 100.

The target fin retention regions that are incorporated into sub-patterns 100A, 100B are selected and spaced such that the sub-patterns may be readily formed in respective masking layers using available photolithography tools. When the mask design process is completed, data corresponding to sub-patterns 100A, 100B will be provided to a mask manufacture that will produce tangible photomasks corresponding to sub-patterns 100A, 100B to be used in a photolithography tool to manufacture integrated circuit products.

Notably, the master pattern layout 100 in this illustrative example is decomposed into two sub-patterns for generating two corresponding photomasks. The associated multi-patterning process is referred to as a double-patterning process. It will be appreciated, however, that additional sub-patterns may be used to define additional structures in a higher order multi-patterning process. In certain embodiments, the multi-patterning process can be an n order process where the master pattern layout is decomposed into a total of n sub-patterns, where n is an integer greater than 1.

In the comparative example of FIG. 1, first and second sub-patterns 100A, 100B are distinct and complementary. That is, first and second sub-patterns 100A, 100B do not overlap in any respect and together define target fin retention regions 101-104 for retaining fins within target regions 201 to the exclusion of fins within target regions 202.

As will be appreciated, the uniformity of the first sub-pattern 100A, which is illustrated as having a width d1 greater than the width d2 of second sub-pattern 100B, is inherently better than the uniformity of second sub-pattern 100B due to the relaxed constraints, e.g., pitch and CD, associated with the first sub-pattern. However, the minimum width, space constraints and alternating pitch of the second sub-pattern 100B can induce more pattern variability than is desired, e.g., for edge placement between adjacent fins in order to accurately cut the fins.

Figure 2:
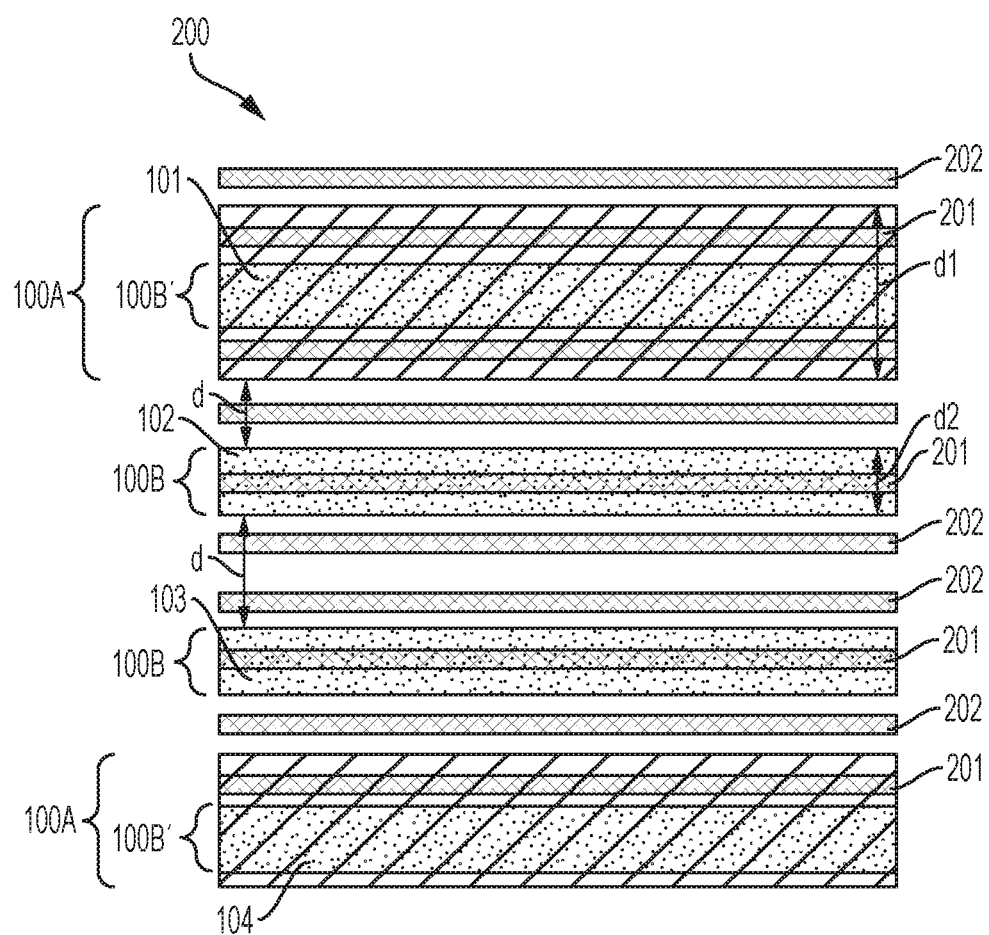
FIG. 2 is a schematic diagram showing a first sub-pattern and a second sub-pattern comprising dummy features overlying portions of the first sub-pattern.

Turning FIG. 2, shown is an example double patterning geometry including a dummy feature formed within an extraction region of an SRAM cell. The illustrated example is a two-mask embodiment with rules placement dummy features added to the second mask. The master pattern layout 200 for the SRAM cell includes four target semiconductor fin retention regions that are correspondingly numbered 101, 102, 103 and 104, and which overlie target regions 201 for semiconductor fins to be formed over a semiconductor substrate. Master pattern layout 200 satisfies the patterning constraints of individual fin color masking levels.

As with the comparative example of FIG. 1, the target fin retention regions 101-104 in FIG. 2 define the locations of one or more masking layers (N>1, e.g., N>3) used to protect underlying fins within target regions 201 during an etch process that removes unprotected fins within target regions 202 in order to define a desired architecture.

The width (d1, d2) of target fin retention regions in FIG. 2 may independently range from 25 to 100 nm, e.g., 25, 30, 35, 40, 45, 50, 55, 60, 65, 70, 75, 80, 85, 90, 95 or 100 nm, including ranges between any of the foregoing values. The spacing (d) between adjacent target fin retention regions may range from 25 to 75 nm, e.g., 25, 30, 35, 40, 45, 50, 55, 60, 65, 70 or 75 nm, including ranges between any of the foregoing values. In certain embodiments, the space between the target fin retention regions 101-104 in the master pattern layout 200 is such that the master pattern layout 200 cannot be printed using a single mask with available photolithography tools.

The master pattern layout 200 is decomposed into a first sub-pattern 100A including the target fin retention regions 101 and 104, and a second sub-pattern 100B including the target fin retention regions 102 and 103.

In the example of FIG. 2, first and second sub-patterns 100A, 100B are complementary and define a pattern identical to the pattern of FIG. 1 for retaining fins within target regions 201 to the exclusion of fins within target regions 202. However, dummy features 100B' of second sub-pattern 100B overlap portions of the first sub-pattern 100A, which modifies the periodicity of the second sub-pattern 100B and improves the fidelity of non-redundant features within the second sub-pattern 100B. Thus, dummy features 100B' do not contribute to the overall shape of the final pattern, but influence the pattern fidelity of non-dummy features within the same masking level, resulting in an improved print process variation (PV) band and print CDU of the single fin sub-patterns 100B adjacent to the dummy features 100B' on the same masking level.

According to various embodiments, first and second sub-patterns 100A, 100B are either distinct and complementary or one or the first and second sub-patterns is redundant. That is, the disclosed multi-pattern architecture avoids forming a first sub-pattern that only partially overlies a second sub-pattern while the second sub-pattern only partially overlies the first sub-pattern.

According to various embodiments, the eligible region for the inclusion of a dummy feature within a particular masking level is a subset of the pattern of one or more of the other masking layers in the workflow. In the example of a master pattern layout comprising a first sub-pattern and a second sub-pattern, such as in connection with a lithography-etch, lithograph-etch (LELE) patterning process, the eligible region for the inclusion of a dummy feature within the second sub-pattern is a subset of the first sub-pattern, and the eligible region for the inclusion of a dummy feature within the first sub-pattern is a subset of the second sub-pattern.

In embodiments comprising three or more patterning steps such as, for example, an LELELE patterning process, the eligible region for the inclusion of a dummy feature within the any one of the sub-patterns is the union of the remaining sub-patterns. As will be appreciated, the one or more of the other masking layers may be defined before or after patterning the masking level containing the dummy feature.

An extraction region for inclusion of the dummy features may be a rules-based or algorithm-based subset of the available redundant area. That is, in addition to the requirement that a dummy feature overlie a portion of another sub-pattern and therefore not contribute to the overall intent of the pattern, the incorporation of a dummy feature into a particular masking layer is subject to intra masking level constraints, such as critical dimension and periodicity rules (i.e., dummy feature to non-dummy feature spacing).

Figures 3, 4:
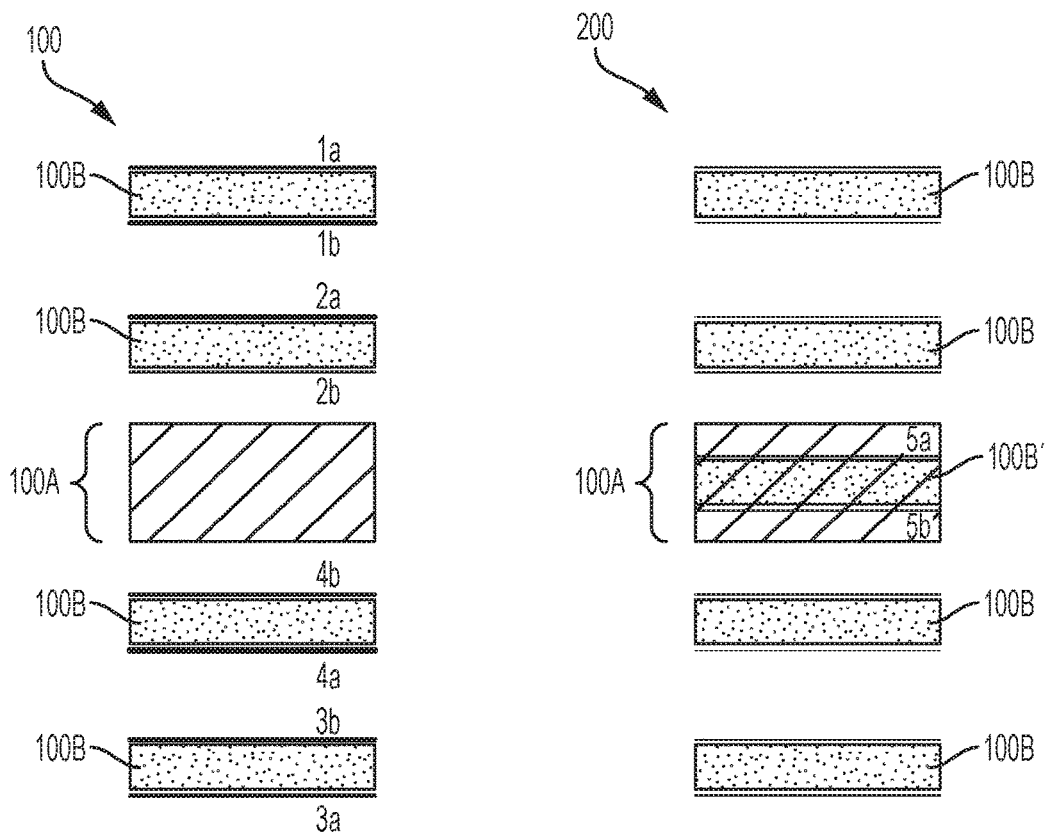
FIG. 3 is a schematic diagram of a comparative pattern layout including first and second sub-patterns.
FIG. 4 is a schematic diagram of a pattern layout including a first sub-pattern and a second sub-pattern including a dummy feature overlying a portion of the first sub-pattern.

By incorporating a dummy feature into a sub-pattern, the fidelity of non-dummy features at the same masking level can be improved. The impact on pattern fidelity can be seen by evaluating the perturbation of features within pattern layouts that do and do not include dummy features. Normalized process variation (PV) data for selected feature characteristics (e.g., edge variability) within the comparative and example masking levels depicted in FIGS. 3 and 4 are summarized in Table 1. The process variation (PV) data provides a statistical metric of variation in patterning placement. A lower PV value is indicative of less pattern uncertainty, i.e., greater fidelity.

Referring to Table 1, the CD uniformity for process variation bands shows an improvement of the master pattern layout 200 of FIG. 4 relative to the comparative master pattern layout 100 of FIG. 3. According to various embodiments, the pattern variability, such as the patterned edge variability, can be decreased (improved) by as much at 50%, e.g., 20, 25, 30, 35, 40, 45 or 50%, including ranges between any of the foregoing values. This is illustrated in FIGS. 3 and 4 with respect to a plurality of single fin target retention regions.

TABLE 1

Process Variation Calculations for Comparative and Example Structures

| Edge | Comparative Layout | Example Layout | % Change |
|---|---|---|---|
| 1a | 0.9 | 0.7 | −23.8% |
| 1b | 1 | 0.6 | −34.8% |
| 2a | 1 | 0.6 | −34.8% |
| 2b | 0.8 | 0.7 | −25% |
| 3a | 0.9 | 0.7 | −23.8% |
| 3b | 1 | 0.6 | −34.8% |
| 4a | 1 | 0.6 | −41.7% |
| 4b | 0.9 | 0.7 | −23.8% |
| 5a | N/A | 0.7 | N/A |
| 5b | N/A | 0.7 | N/A |

By inserting an additional dummy feature on at least one of the masking levels, the periodicity of the pattern containing the dummy features is changed and, in various embodiments, approaches that of a grating, which has a better printability compared to a mask from which the dummy features are omitted. The dummy features do not, however, introduce any change to the overall patterned image. In certain embodiments, redundant features have the same areal dimensions as non-redundant features on the same masking level.

The disclosed method and associate structure can improve manufacturing yield. For instance, improved CD uniformity for the various sub-patterns can decrease the number of fins that are cut or kept unintentionally.

According to various embodiments, a master pattern layout comprises a first masking layer having first features and a second masking layer having second features, wherein a first portion of the second features are disposed laterally adjacent to the first features and a second portion of the second features entirely overlie the first features.

Disclosed are methods and structures that provide improvements in pattern fidelity both for lithographic exposure and etch transfer without requiring any additional cut or removal mask, and without introducing any change to the final patterned image. The method may be extended to a variety of multiple exposure patterning schemes having two or more exposure steps.

In various embodiments, design tools can be provided and configured to create the data sets used to pattern dielectric, conducting, or semiconductor layers as described herein. For example, data sets can be created to generate photomasks used during lithography operations to pattern the layers to form a variety of structures and devices. Such design tools can include a collection of one or more modules and can also include hardware, software, or combinations thereof. Thus, for example, a tool may be a collection of one or more software modules, hardware modules, software/hardware modules or any combination or permutation thereof. As another example, a tool can be a computing device or other appliance on which software runs or in which hardware is implemented.

As used herein, a module might be implemented utilizing any form of software, hardware, or a combination thereof. For example, one or more processors, controllers, application-specific integrated circuits (ASIC)s, programmable logic arrays (PLA)s, logical components, software routines, or other mechanisms might be implemented to make up a module. During their implementation, the various modules may be implemented as discrete modules or the functions and features described can be shared in part or in total among one or more modules. For instance, the various features and functionality described herein may be implemented in any given application and can be used in one or more separate or shared modules in various combinations and permutations.

Even though various features or elements of functionality may be individually described as separate modules, one of ordinary skill in the art will understand that these features and functionality can be shared among one or more common software and hardware elements, and such description shall not require or imply that separate hardware or software components are used to implement such features or functionality.

As used herein, the singular forms "a," "an" and "the" include plural referents unless the context clearly dictates otherwise. Thus, for example, reference to a "dummy feature" includes examples having two or more such "dummy features" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an anode that comprises lithium titanium oxide and a carbon material selected from the group consisting of hard carbon and graphite include embodiments where an anode consists of lithium titanium oxide and a carbon material and embodiments where an anode consists essentially of lithium titanium oxide and a carbon material.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor device, comprising:
    forming a first masking layer over a semiconductor substrate, the first masking layer comprising first features; and
    forming a second masking layer over the semiconductor substrate, the second masking layer comprising second features, wherein
    a first portion of the first features are formed laterally adjacent to the second features, a second portion of the first features entirely overlie the second features, a first portion of the second features are formed laterally adjacent to the first features, and a second portion of the second features entirely overlie the first features, wherein the first features have a constant width and the second features have a constant width different from the width of the first features, and wherein the semiconductor device comprises an SRAM.

2. The method of claim 1, wherein the second masking layer is formed after forming the first masking layer.

3. The method of claim 1, wherein the first features of the first masking layer are arranged at an inter-feature spacing of 25 to 75 nm.

4. The method of claim 1, wherein the second features of the second masking layer are arranged at an inter-feature spacing of 25 to 75 nm.

5. The method of claim 1, wherein the second features of the second masking layer are arranged at a constant inter-feature spacing of 25 to 75 nm.

* * * * *